United States Patent
Plössl

(10) Patent No.: US 9,368,698 B2
(45) Date of Patent: Jun. 14, 2016

(54) CONVERTER PLATE, A RADIATION-EMITTING DEVICE HAVING SUCH A CONVERTER PLATE AND A METHOD OF PRODUCING SUCH A CONVERTER PLATE

(75) Inventor: Andreas Plössl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/344,235

(22) PCT Filed: Aug. 16, 2012

(86) PCT No.: PCT/EP2012/066036
§ 371 (c)(1),
(2), (4) Date: May 20, 2014

(87) PCT Pub. No.: WO2013/041313
PCT Pub. Date: Mar. 28, 2013

(65) Prior Publication Data
US 2015/0011037 A1    Jan. 8, 2015

(30) Foreign Application Priority Data
Sep. 19, 2011 (DE) .......................... 10 2011 115 083

(51) Int. Cl.
*H01L 21/00* (2006.01)
*H01L 33/50* (2010.01)
*H01L 33/00* (2010.01)

(52) U.S. Cl.
CPC ............ *H01L 33/505* (2013.01); *H01L 33/005* (2013.01); *H01L 33/508* (2013.01); *H01L 2924/0002* (2013.01); *H01L 2933/0058* (2013.01); *Y10T 29/49993* (2015.01); *Y10T 428/24273* (2015.01)

(58) Field of Classification Search
CPC ..................... H01L 2933/0058; H01L 33/505; H01L 33/508; H01L 33/005; Y10T 29/49993
See application file for complete search history.

(56) References Cited

U.S. PATENT DOCUMENTS

| 2009/0058263 | A1 | 3/2009 | Lai |
| 2011/0044026 | A1 | 2/2011 | Deeben et al. |
| 2012/0007131 | A1 | 1/2012 | Ueno et al. |
| 2012/0038665 | A1 | 2/2012 | Strietzel |

FOREIGN PATENT DOCUMENTS

| DE | 10 2005 040 558 | 3/2007 |
| DE | 10 2007 003 785 | 7/2008 |
| DE | 10 2008 012 407 | 8/2009 |

(Continued)

OTHER PUBLICATIONS

Nordson ASYMTEK handout: "LED Assembly. Dispensing Solution for Tight CIE LEDs," Nordson ASYMTEK, 2747, Laker Avenue West, Carlsbad, USA 92010-6603, www.nordsonasymtek.com, Dec. 17, 2010.

(Continued)

*Primary Examiner* — Richard Booth
(74) *Attorney, Agent, or Firm* — DLA Piper LLP (US)

(57) ABSTRACT

A converter plate adapted to be attached to a radiation-emitting semiconductor chip, the converter plate containing a base material made of glass in which a plurality of openings is arranged, in each of which a converter material is installed.

14 Claims, 2 Drawing Sheets

(56) References Cited

FOREIGN PATENT DOCUMENTS

| | | |
|---|---|---|
| EP | 1 119 058 | 7/2001 |
| JP | 2002-289925 | 10/2002 |
| JP | 2006-179684 | 7/2006 |
| JP | 2008-227042 | 9/2008 |
| JP | 2012-527742 | 11/2012 |
| WO | 2008/044759 | 4/2008 |
| WO | 2009/136351 | 11/2009 |
| WO | 2010/134331 | 11/2010 |

OTHER PUBLICATIONS

English translation of corresponding Notice of Reasons for Rejection dated Jan. 20, 2015 of Japanese Application No. 2014-530136.
English translation of the First Office Action dated Dec. 25, 2015 of corresponding Chinese Application No. 201280045661.5.

CONVERTER PLATE, A RADIATION-EMITTING DEVICE HAVING SUCH A CONVERTER PLATE AND A METHOD OF PRODUCING SUCH A CONVERTER PLATE

TECHNICAL FIELD

This disclosure relates to a converter plate for a radiation-emitting device, a radiation-emitting device having such a converter plate and a method of producing such a converter plate.

BACKGROUND

To create a semiconductor device that emits white light it is possible to cover a semiconductor chip that emits blue radiation with a converter layer that converts blue light into longer wavelength light. White light is generated, for example, by superimposition of blue and yellow radiation. The thickness of the converter layer determines the proportions of the blue and yellow light in the white mixed radiation. To obtain a specific desired white tone, exact control of the converter layer thickness is necessary. Such control of the layer thickness is difficult, however, and can be achieved only at some expense. A particular disadvantage is that elaborate metering procedures are necessary for that purpose.

There is thus a need to provide a converter plate with which a desired white tone can be generated, a radiation-emitting semiconductor device having such a converter plate and a simplified method of producing such a converter plate.

SUMMARY

I provide a converter plate adapted to be attached to a radiation-emitting semiconductor chip, the converter plate containing a base material made of glass in which a plurality of openings is arranged, in each of which a converter material is installed.

I also provide a radiation-emitting device having a radiation-emitting semiconductor chip that emits blue radiation and has a converter plate.

I further provide a method of producing a converter plate for a radiation-emitting semiconductor chip, including:
a) providing a base material made of glass in the form of a plate,
b) forming a plurality of openings in the base material, and
c) installing a converter material in each of the openings.

Lastly, I provide a method of producing a radiation-emitting device including:
providing a converter plate,
providing a radiation-emitting semiconductor chip that emits blue radiation, and
applying and affixing the converter plate to the radiation-emitting semiconductor chip.

DETAILED DESCRIPTION

Figure 1:
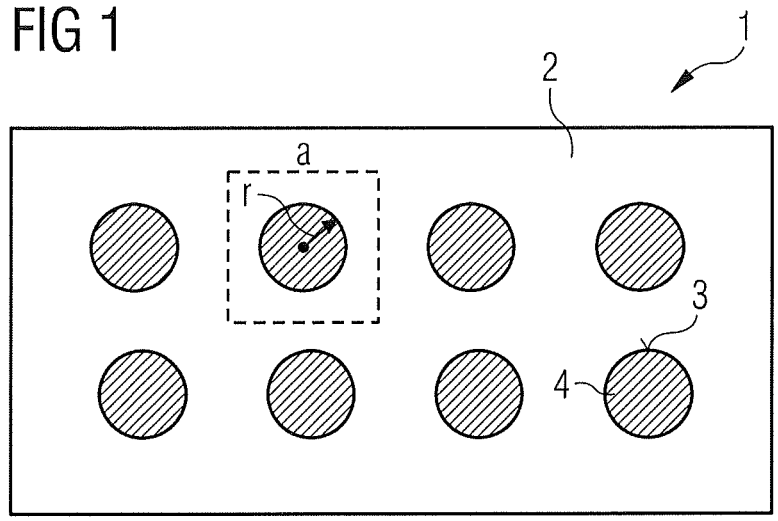
FIG. 1 is a diagrammatic plan view of an example of a converter plate.

My converter plates for a radiation-emitting semiconductor device contain a base material made of glass in which at least one opening is arranged. A converter material is installed in the at least one opening.

Accordingly, the converter plate is a glass plate which contains converter material only in certain regions. The relative proportions of converter material and base material govern the relative proportions of converted radiation and unconverted radiation and thus the color location of the mixed radiation.

The color location is to be understood hereinbelow as meaning especially the numerical values that describe the color of the emitted light in the CIE color space. The CIE color space is, in particular, the CIE standard colorimetric system (also known as CIE 1931). The CIE standard colorimetric system is based on measured values which are related to a normal observer and which can be represented in a CIE standard chromaticity diagram. On the CIE standard chromaticity diagram the area of possible color is plotted on a coordinate system on which the X-component and the Y-component of any desired color can be read off directly.

The converter plate having the base material made of glass has the advantage that such glass plates can be produced by a variety of methods, for example, in the form of flat glass, in a very exactly adjustable thickness. Furthermore, it is possible to make precise openings or holes in glass, for example, by a laser-assisted microstructuring process. In addition, glass is a very stable base material which can advantageously be provided with a plurality of openings or holes without adversely affecting the stability of the plate as a whole. Moreover, glass is available with different refractive indices and softening temperatures. This provides inter alia scope to improve the coupling-out of light and to balance the proportions by area of base material and converter material. In addition, glass can be used at very high temperatures as are necessary, for example, to cure the converter material.

An "opening" is to be understood as meaning that the opening extends all the way through the base material, in particular through the entire thickness of the glass. An opening is accordingly a hole in the base material in the region of which no base material is arranged. The thickness of the glass of the base material therefore corresponds to the depth of the opening or the depth of the hole.

The base material may be radiation-permeable at least to radiation in the blue wavelength range. That means that the base material is substantially transparent to blue radiation. Substantially transparent means in particular that the base material is at least 80%, preferably 90%, especially preferably 95%, radiation-permeable or transparent to blue radiation.

The converter plate is accordingly distinguished by regions in which the base material is arranged, which are transparent to blue radiation, and by regions, preferably adjacent thereto, in which there is arranged not base material, but converter material that is able to convert radiation of one wavelength range into radiation of another wavelength range. Radiation leaving the converter plate is accordingly composed of unconverted radiation which passes through the base material, and converted radiation, which has been converted in the converter plate. The ratio by area of base material to converter material determines the relative proportions of converted and unconverted light. The ratio is determined, for example, on the radiation exit side of the converter plate.

The converter material may completely fill the at least one opening. It is thus possible to achieve a uniform thickness of converter material dependent upon the thickness of the glass or the thickness of the base material and, therefore, the thickness of the converter plate. The converter material and the base material preferably terminate flush with one another.

The at least one opening and/or the converter material may be so dimensioned that in the region of the opening full conversion of radiation in the blue wavelength range can be achieved. The thickness of the converter plate or the thickness of the glass can therefore be adjusted such that the converter material, which preferably completely fills the at least one opening, has precisely the thickness required to achieve full conversion of blue radiation in the converter material.

The at least one opening may have a truncated-cone-like shape. That means, in particular, that the at least one opening tapers in one direction along the thickness of the glass. The opening preferably has an approximately circular or elliptical cross section.

The base material may have a higher refractive index than silicone. The converter material can therefore be embedded in a medium having a higher refractive index than the silicone usually used, which advantageously promotes and accordingly improves the coupling-out of the light of a semiconductor chip arranged, for example, upstream, or the coupling-in of the light into the converter material. In addition, the base material made of glass having the at least one opening and the converter material installed therein is better able to adapt to the thermal expansion of a semiconductor chip arranged, for example, upstream than in the case of silicone, which improves reliability of the connection between converter plate and semiconductor chip.

The converter material may be able to convert blue radiation into longer wavelength radiation, for example, yellow and/or red and/or green radiation. For that purpose the converter material comprises at least one wavelength conversion material. The wavelength conversion material can be incorporated, for example, in the form of particles, into a matrix material. Furthermore, it is possible for the wavelength conversion material to be in the form of especially a ceramics solid body.

The at least one wavelength conversion material may have an Eu-doped and/or La-doped wavelength conversion material. Eu-activated and La-activated wavelength conversion materials in particular have been found to have an intensity-dependent conversion efficiency.

The at least one wavelength conversion material may be a nitridic wavelength conversion material. In particular, the at least one wavelength conversion material can be selected from a $(Sr,Ca,Ba)_2Si_5N_8$-based, a $(Sr,Ca,Ba)SiN_3$-based and a CaAlSiN-based wavelength conversion material. Such nitridic wavelength conversion materials, especially Eu-doped nitridic wavelength conversion materials, can preferably convert blue light into red light.

The at least one wavelength conversion material may be selected from an ortho-silicate, a nitrido-orthosilicate and a sialon. In particular, the wavelength conversion material can be selected from an Eu-doped orthosilicate, an Eu-doped nitrido-orthosilicate or an La-doped nitrido-orthosilicate. Such wavelength conversion materials can preferably convert blue light into green to yellow light.

The converter plate accordingly has regions made of glass preferably transparent to blue radiation and regions made of converter material that convert blue radiation. Accordingly, depending upon the region in question, blue radiation coupled into the converter plate from one side either passes unconverted through the base material and is coupled out of the converter plate as blue radiation or is converted in the converter material into longer wavelength radiation which is then coupled out of the converter plate. In the region of the converter material, preferably full conversion of the blue radiation takes place. The converter material is accordingly able to convert blue radiation completely into radiation in the longer wavelength range. The radiation leaving the converter material accordingly has no blue component or virtually no blue component. Here, this should not be understood as meaning that a very small, production-related component of blue radiation does not pass unconverted through the converter material. Full conversion is especially to be understood as meaning that at least 90%, preferably more than 95%, of the blue radiation is converted into longer wavelength radiation by the converter material.

A plurality of openings may be arranged in the base material, in each of which converter material is installed. The base material is accordingly perforated by openings. The ratio by area of base material to converter material is chosen such that a desired proportion of blue radiation is converted into longer wavelength radiation so that as a whole a desired mixed radiation in the white color location range is emitted.

The openings may be arranged matrix-like in the base material. "Matrix-like" means that the openings are arranged in a regular pattern in the base material. For example, the openings can be arranged in lines and columns in the base material. The arrangement of the openings can, for example, form a rectangular grid or a triangular grid. As a result of the matrix-like arrangement, it is possible for unconverted blue radiation to leave the converter plate between converted longer wavelength radiation, especially distributed over the entire converter plate, so that improved superimposition of the converted and unconverted radiation is achieved.

The base material and the converter material may be in a ratio of 1:1. That means, for example, that approximately 50% of the glass material of the base material has been replaced by converter material. As a result, advantageously a desired white conversion can be achieved. The ratio can depart from the 1:1 equal distribution within the manufacturing tolerance. For example, variations of up to +/−5% are possible. The ratio can also be based, for example, on the total volume of converter material and base material in the converter plate. In particular, however, it is based on the ratio by area of base material to converter material. The ratio is determined, for example, on the radiation exit side of the converter plate.

A radiation-emitting device may have a radiation-emitting semiconductor chip able to emit blue radiation. Furthermore, the radiation-emitting device has a converter plate which contains glass as base material in which at least one opening is arranged, wherein a converter material is installed in the at least one opening. The blue radiation emitted by the semiconductor chip is coupled out unconverted through the base material. The component of blue radiation emitted by the semiconductor chip that passes through the converter material is preferably completely converted into longer wavelength radiation so that radiation leaving the device comprises both blue components and longer wavelength components. These light components are superimposed, for example, such that the device as a whole emits white radiation.

The semiconductor device is preferably an optoelectronic device which enables electrically generated data or energy to be converted into light emission or vice versa. The semiconductor device has at least one optoelectronic semiconductor chip, preferably a radiation-emitting semiconductor chip. The semiconductor chip is preferably an LED (light-emitting diode), especially preferably a thin-film LED. In the case of thin-film LEDs, in particular a growth substrate on which layers of the semiconductor chip have been grown epitaxially has been partially or fully detached.

The semiconductor chip has a semiconductor layer stack in which an active layer is present. The active layer is especially able to generate blue radiation. For that purpose the active layer preferably contains a pn-junction, a double heterostructure, a single quantum well structure (SQW, single quantum well) or a multiple quantum well structure (MQW, multi quantum well) to generate radiation. The term quantum well structure does not have any significance here in respect of the dimensionality of the quantisation. It encompasses inter alia quantum troughs, quantum wires and quantum dots and any combination of those structures.

The semiconductor layer stack of the semiconductor chip preferably contains a III/V semiconductor material. III/IV-semiconductor materials are especially suitable for generating radiation ranging from the ultraviolet via the visible into the infrared spectral range.

The base material and the converter material may be in a specifiable ratio to one another such that the radiation-emitting device emits light of a specifiable color and/or of a specifiable color location range. If, for example, cold white light is to be generated, it is sufficient for about 17% of the blue radiation to pass unconverted through the converter plate. The remaining radiation is then converted. The ratio of base material to converter material is chosen accordingly.

A method of producing a converter plate for radiation-emitting semiconductor devices may comprise the following steps:

a) providing a base material made of glass in the form of a plate,
b) forming at least one opening in the base material, and
c) installing a converter material in the at least one opening.

By such a production method it is possible to provide a converter plate which, in certain regions, contains a preferably transparent base material made of glass and, in certain regions adjacent thereto, contains a converter material. Radiation passing through the converter plate can in certain regions, in particular in the region of the base material, pass unconverted through the converter plate and, in certain regions adjacent thereto, can be converted in the converter material into radiation of a different wavelength. The ratio by area of transparent glass to converter material determines the relative proportions of converted and unconverted light, preferably of blue and longer wavelength light. The size of the openings is such that full conversion takes place in the converter material.

In step a) there are preferably produced glass plates, for example, a flat glass plate of a very exactly adjustable thickness. Glass is distinguished by a high degree of stability so that in step b) at least one opening can be made in the glass without jeopardising the stability of the glass plate.

Preferably, in step b) the at least one opening is formed by a laser-assisted microstructuring process. Such a process enables precise openings and holes to be made efficiently in the base material made of glass. The size of the openings is matched to the desired degree of conversion.

In accordance with at least one embodiment, in step c) the converter material is installed in the at least one opening by a printing process. By using a printing process to fill the holes it is possible to achieve a uniform thickness having sufficient dimensions for complete conversion.

The converter material is preferably thermally embedded in the base material. In particular, the converter material is cured after installation in the opening in the base material. The use of glass as a base material allows higher temperatures than, for example, the silicone usually used. In particular, a glass material having the desired refractive index and a desired softening temperature can be used.

In step b) a plurality of openings may be formed in the base material and in step c) converter material may be installed in each opening. The number and size of the openings in the base material is dependent upon the desired degree of conversion and especially upon the desired resulting color location. In particular, the ratio by area of base material to converter material can be used to adjust the ratio of converted radiation to unconverted radiation.

Further advantages and advantageous developments will be found in the examples described below in conjunction with FIGS. 1 to 4.

In the Figures, parts that are identical or have identical action are in each case denoted by identical reference numerals. The parts illustrated and the relative sizes of the parts to one another should not be regarded as to scale; rather the thickness or size of individual elements such as, for example, layers, structures, components and regions, may have been shown exaggerated for the purpose of better clarity and/or better understanding.

FIG. 1 shows a plan view of a converter plate 1 containing a base material 2. The base material 2 is preferably a glass material, for example, a flat glass. Openings 3 are arranged, especially matrix-like, in the base material 2. The openings 3 extend through the entire thickness of the glass of the base material. The openings 3 have an elliptical, preferably round cross section. The openings 3 are preferably identical or almost identical in size. The number of openings 3 in the base material 2 is shown only by way of example in FIG. 1. The number of openings 3 in the base material 2 can vary, depending upon the desired use and depending upon the desired degree of conversion.

A converter material 4 is installed in each of the openings 3. In particular, the converter material 4 completely fills each of the openings 3. The thickness of the glass of the base material 2 accordingly corresponds to the thickness of the converter material. The converter material 4 is preferably able to convert blue radiation into longer wavelength radiation, for example yellow radiation. Here, the size of the openings and accordingly of the converter material 4 in each case is matched to a desired color location. In particular, the openings 3 and the converter material 4 are so dimensioned that, in the region of each opening 3, full conversion of radiation in the blue wavelength range into longer wavelength radiation can be achieved.

For that purpose the base material 2 and the converter material 4 are, for example, in a ratio of 1:1. That means that about 50% of the surface area of the glass has been replaced by converter material.

For example, in the case of a base material composed of flat glass 100 µm thick with openings of diameter 50 µm in a square arrangement, the hole spacing is about 87 µm.

In particular, a rectangle of side length a can be drawn around each opening. To then obtain a ratio of converter material to base material of 50%, the surface area of the opening must be equal to half the surface area of the rectangle. In the case of an opening of radius r this results in the following relationship:

$$2r^2\pi = \tfrac{1}{2}a^2,$$

from which it follows that $$a = 2r\sqrt{\pi}$$

With a converter plate so constructed, the relative proportions of converted and unconverted light can be controlled and adjusted by way of the ratios by area of base material to converter material. The converter material is preferably dimensioned so that it completely converts the blue light into longer wavelength radiation.

The base material and the converter material are in a specifiable ratio to one another such that the radiation-emitting device emits light of a specifiable color and/or of a specifiable color location range. If, for example, cold white light is to be generated, it is sufficient for about 17% of the blue radiation to pass unconverted through the converter plate. The remaining radiation is then converted. The ratio of base material to converter material is chosen accordingly. If, for that purpose, it is assumed that the refractive indices of glass and a ceramic converter material are approximately the same and scatter effects are ignored, assuming a blue component of 17% instead of 50% the above-mentioned formula gives a value of $a=3.26$ r. Assuming that a 180 µm thickness of the converter material is sufficient for full conversion, a hole radius of $r=10$ µm gives a hole spacing of 33 µm for glass 180 µm thick. The example shows that, depending upon the desired color or color temperature of the mixed light, a suitable hole spacing and therefore a suitable ratio by area of converter material to base material can be chosen. The ratio of unconverted to converted light depends generally upon the emission spectrum of the semiconductor chip, the emission wavelength of the semiconductor chip, the desired color temperature, the desired color location, the refractive index of the base material, the refractive index of the converter material and the scatter characteristics of the base material and the converter material.

Converter plates having a base material made of glass can be produced with very exactly adjustable thicknesses using an extremely wide range of methods. In addition, in the case of glass it is possible to make precise holes or openings efficiently in the base material, for example, by a laser-assisted microstructuring process. Since glass is a very stable material, a large number of openings can be made in the base material. These openings are then completely filled with converter material, for example, by a printing process, with the result that a uniform thickness that is suitable for complete conversion can be achieved.

Glass as a base material is available in an extremely wide range of refractive indices and softening temperatures. This provides scope to improve the coupling-out of light and to balance the proportions by area of glass and converter material. Furthermore, glass as a base material allows the use of temperatures that are necessary, for example, for curing the converter material. As a result, converter particles can be embedded in a base material having a high refractive index, especially have a higher refractive index than the silicone usually used, which promotes the coupling-out of the light from a designated semiconductor chip or the coupling-in of the light of a designated semiconductor chip into the converter material. In addition, the converter plate made of glass having the converter material installed therein is advantageously able to adapt well to any thermal expansion of a designated semiconductor chip occurring during operation, in particular better than in the case of silicone, thus advantageously improving the reliability of the connection between the converter plate and a designated semiconductor chip.

The glass as a base material is, for example, an alkali-free glass having a forming temperature of about 720° C. The thermal expansion coefficient (CTE) is, for example, about 7 ppm/K, that is to say in the region of the thermal expansion coefficient of the semiconductor chip downstream of which the converter plate is arranged. The semiconductor chip can be, for example, a thin-film semiconductor chip having a carrier composed of or containing Ge and/or Mo:Cu. The base material is preferably radiation-permeable, especially transparent, at least to radiation in the blue wavelength range. If, for example, blue radiation is coupled into the converter plate, the component of blue radiation in the region of the base material passes through the converter plate unaffected. That blue radiation accordingly leaves the converter plate again as blue radiation. In the region of the converter material, however, the component of blue radiation is converted into longer wavelength radiation, in particular full conversion takes place in the region of the converter material, so that in the regions of converter material only longer wavelength radiation is coupled out of the converter plate. Accordingly, the radiation leaving the converter plate as a whole is composed of blue radiation and longer wavelength radiation which intermix by superimposition to form white radiation. The exact color location of the white radiation is adjusted by way of the ratio by area of base material to converter material.

Figure 2A:
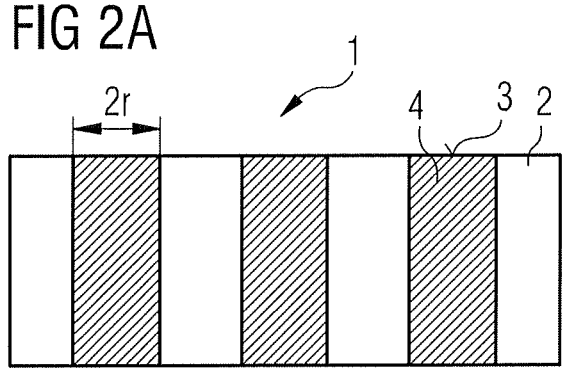
FIGS. 2A and 2B each show a diagrammatic cross section through an example of a converter plate.

FIG. 2A shows a cross section through the converter plate of the example of FIG. 1. The openings 3 pass all the way through the base material 2 and are completely filled with converter material 4 so that in cross section an alternating sequence of converter material and base material is formed. The radiation coupled into the converter plate 1 is able to pass unconverted through the base material 2. In the region of the converter material 4, the radiation coupled into the converter plate 1 is completely converted into radiation of a different wavelength, especially into longer wavelength radiation.

Figure 2B:
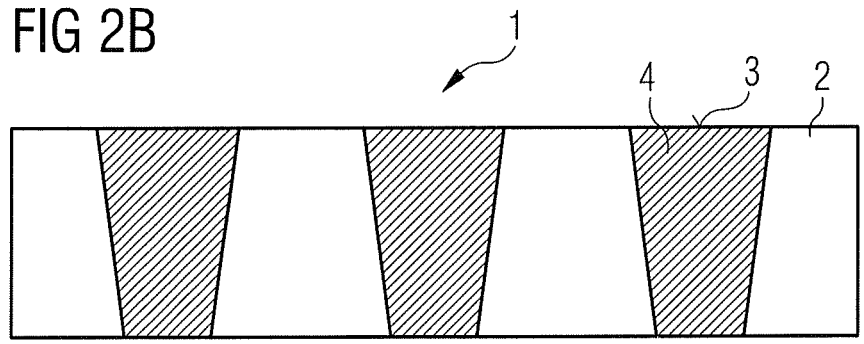

FIG. 2B shows an alternative example in a cross section, for example, through a converter plate, in accordance with the example of FIG. 1. The openings 3 through the base material 2 have a truncated-cone-like shape. In particular, the openings 3 are arranged to taper in a direction along the base material 2. Here, the openings 3 are preferably all tapering identically to one another. That means that the openings 3 are of identical or almost identical shape. The base material 2 likewise has a truncated-cone-like shape in cross section, but tapers in the opposite direction to the tapering of the converter material 4 or the openings 3.

Figure 3:
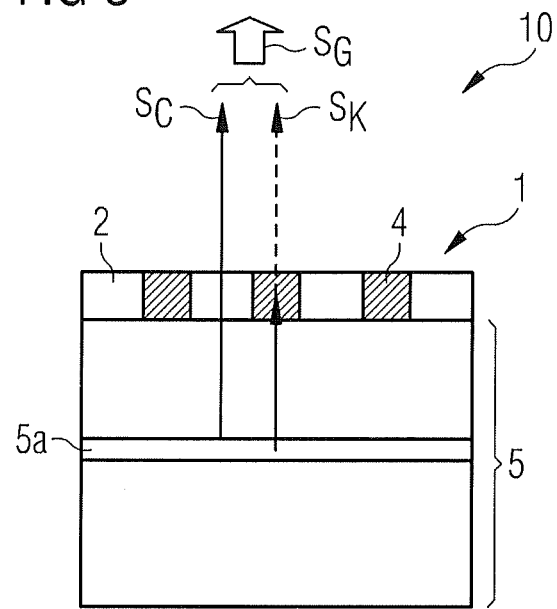
FIG. 3 shows a diagrammatic cross section through an example of a semiconductor device.

FIG. 3 shows a radiation-emitting semiconductor device 10 which comprises a radiation-emitting semiconductor chip 5 that is preferably able to emit blue radiation $S_C$. A converter plate 1 is arranged on a radiation coupling-out side of the semiconductor chip 5. The converter plate 1 preferably corresponds to one of the examples of FIG. 1 or 2.

The semiconductor chip 5 has an active layer 5a to generate radiation, which layer is able to emit radiation in the blue wavelength range during operation. The semiconductor chip 5 has a semiconductor layer sequence based on a III/IV semiconductor material. The active layer 5a is integrated in the semiconductor layer sequence. The semiconductor chip 5 is preferably an LED.

The converter plate 1 arranged downstream of the semiconductor chip 5 has a base material 2 in which there are arranged openings having the converter material 4 installed therein. The base material 2 is transparent or radiation-permeable to the radiation emitted by the semiconductor chip 5. That means that radiation emitted from the active layer 5a in the direction of the converter plate 1 is coupled into the converter material in the region of the base material 2 and is transmitted unconverted through the converter plate 1. That radiation is accordingly coupled out on the side of the converter plate 1 remote from the semiconductor chip 5 in the form of blue radiation $S_C$. That radiation component of the radiation emitted by the semiconductor chip 5 is accordingly unaffected in the converter plate 1 in respect of color location.

The radiation emitted by the active layer 5a that is coupled into the converter plate 1 in the region of the converter material 4 is converted into longer wavelength radiation in the converter material 4 and coupled out of the converter plate 1 in the form of longer wavelength radiation, for example, yellow radiation, $S_K$. Accordingly, both blue radiation $S_C$ and yellow radiation $S_K$ are emitted on the side of the converter plate 1 remote from the semiconductor chip 5. These radiation components are superimposed to form, as a whole, white mixed radiation $S_G$. The semiconductor device is accordingly a white-emitting semiconductor device. The color location of the white radiation depends upon the ratio of the area of the converter material to the area of the base material. It is accordingly possible to adjust a desired white color location by way of the ratios by area.

Figure 4:
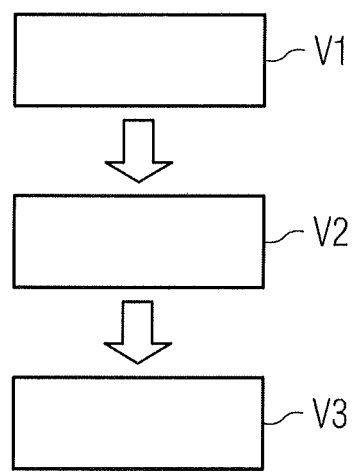
FIG. 4 is a diagrammatic flow diagram of an example of my method to produce a converter plate.

FIG. 4 shows a flow diagram of a method of producing a converter plate constructed, for example, in a similar way to a converter plate of FIGS. 1 to 3. In step $V_1$ a base material made of glass in the form of a plate is provided. After provision of the base material, in step $V_2$ an opening or a plurality of openings is/are formed in the base material. These openings are preferably formed by a laser-assisted microstructuring process, with the result that the openings are given a truncated-cone shape. In the next step $V_3$, a converter material is installed in the opening or openings. The converter material is preferably installed by a printing process. A printing process makes it possible, in particular, for the openings to be filled with a uniform thickness of converter material. The thickness is preferably adjusted such that in the openings, that is to say in the converter material, full conversion of blue radiation into longer wavelength radiation can be achieved.

After installation of the converter material in the openings, the latter are cured at high temperatures. After the production of the converter plate it can be applied to a designated semiconductor chip and affixed thereto, for example, by a pick-and-place method. The converter plate made of glass with the converter material installed therein is advantageously better able to adapt to the thermal expansion of the semiconductor chip than in the case of silicone, thus improving the reliability of the connection between converter plate and semiconductor chip.

The description with reference to the examples does not limit the invention thereto, but rather the disclosure encompasses any novel feature and any combination of features, including in particular any combination of features in the appended claims, even if those features or those combinations are not themselves explicitly defined in the claims or examples.

The invention claimed is:

1. A converter plate adapted to be attached to a radiation-emitting semiconductor chip, the converter plate containing a base material made of glass in which a plurality of openings is arranged, in each of which a converter material is installed, wherein
   the openings and/or the converter material is dimensioned such that in a region of each opening, full conversion of radiation in a blue spectral range can be achieved,
   the regions made out of the base material are configured such that radiation in the blue spectral range transmits said regions unconverted, and
   converted radiation and unconverted radiation mix to form white light.

2. The converter plate according to claim 1, wherein the base material is radiation-permeable at least to radiation in the blue wavelength range.

3. The converter plate according to claim 1, wherein the converter material completely fills each of the openings.

4. The converter plate according to claim 1, wherein each opening has a truncated-cone-like shape.

5. The converter plate according to claim 1, wherein the base material has a higher refractive index than silicone.

6. The converter plate according to claim 1, wherein the converter material converts blue radiation into longer wavelength radiation.

7. The converter plate according to claim 1, wherein the openings are arranged matrix-like in the base material.

8. A radiation-emitting device having a radiation-emitting semiconductor chip that emits blue radiation and has a converter plate according to claim 1.

9. The radiation-emitting device according to claim 8, wherein the base material and the converter material are in a specifiable ratio to one another such that the radiation-emitting device emits light of a specifiable color and/or of a specifiable color location range.

10. A method of producing a converter plate for a radiation-emitting semiconductor chip, comprising:
    a) providing a base material made of glass in the form of a plate,
    b) forming a plurality of openings in the base material by a laser-assisted microstructuring process, and
    c) installing a converter material in each of the openings, wherein
       the openings and/or the converter material is dimensioned such that in a region of each opening, full conversion of radiation in a blue spectral range can be achieved,
       the regions made out of the base material are configured such that radiation in the blue spectral range transmits said regions unconverted, and
       converted radiation and unconverted radiation mix to form white light.

11. The method according to claim 10, wherein the converter material is installed in each opening by a printing process.

12. The converter plate according to claim 1, wherein the converter plate is prefabricated.

13. The converter plate according to claim 1, wherein the geometric expansion of the converter plate along the direction perpendicular to a hole radius is at least a factor 2 smaller than the geometric expansion of the converter plate along at least one direction parallel to the hole radius.

14. The method of producing a radiation-emitting device comprising:
    providing a converter plate according to claim 1,
    providing a radiation-emitting semiconductor chip that emits blue radiation, and
    applying and affixing the converter plate to the radiation-emitting semiconductor chip.

* * * * *